United States Patent
Goto et al.

(10) Patent No.: US 12,177,016 B2
(45) Date of Patent: Dec. 24, 2024

(54) WIRELESS COMMUNICATION SYSTEM, WIRELESS COMMUNICATION APPARATUS AND WIRELESS COMMUNICATION METHOD

(71) Applicant: NIPPON TELEGRAPH AND TELEPHONE CORPORATION, Tokyo (JP)

(72) Inventors: Daisuke Goto, Musashino (JP); Kiyohiko Itokawa, Musashino (JP); Yasuyoshi Kojima, Musashino (JP); Fumihiro Yamashita, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/921,131

(22) PCT Filed: May 21, 2020

(86) PCT No.: PCT/JP2020/020056
§ 371 (c)(1),
(2) Date: Oct. 25, 2022

(87) PCT Pub. No.: WO2021/234891
PCT Pub. Date: Nov. 25, 2021

(65) Prior Publication Data
US 2023/0179331 A1 Jun. 8, 2023

(51) Int. Cl.
*H04L 1/00* (2006.01)
*H03M 13/27* (2006.01)
*H04L 5/00* (2006.01)

(52) U.S. Cl.
CPC .......... *H04L 1/0071* (2013.01); *H03M 13/27* (2013.01); *H03M 13/271* (2013.01);
(Continued)

(58) Field of Classification Search
CPC .................. H04L 1/0071; H04L 1/0041; H04L 1/0057; H04L 1/0058; H04L 1/0009;
(Continued)

(56) References Cited

U.S. PATENT DOCUMENTS

2003/0031233 A1* 2/2003 Kim ...................... H04L 1/0068
375/298
2006/0221807 A1* 10/2006 Fukuoka ............... H04L 1/0071
370/203
(Continued)

FOREIGN PATENT DOCUMENTS

JP 2000-349653 A 12/2000

OTHER PUBLICATIONS

Jens Baltersee et al., "Achievable Rate of MIMO Channels With Date-Aided Channel Estimation and Perfect Interleaving", IEEE Journal on Selected Areas in Communications, vol. 19, No. 12, 2001, p. 2358-2368.
(Continued)

*Primary Examiner* — April Y Blair
*Assistant Examiner* — Sazzad Hossain (57) ABSTRACT

A wireless communication apparatus includes an encoding unit, an interleaving processing unit, a modulation unit, and a transmission unit. The encoding unit divides a bit string to be transmitted to a communication destination apparatus which is a wireless communication apparatus at a communication destination in a predetermined period into a plurality of blocks and performs error correction coding for each of the plurality of blocks to generate encoded data. The interleaving processing unit performs interleaving on the encoded data to generate a transmission bit string such that bits of the encoded data which has been generated from one of the plurality of blocks are to be transmitted in a distributed manner in a period where communication quality
(Continued)

between the wireless communication apparatus and the communication destination apparatus is higher than a predetermined value in the predetermined period and in a period where the communication quality is lower than the predetermined value in the predetermined period. The modulation unit modulates the transmission bit string. The transmission unit divides the modulated transmission bit string into a plurality of wireless frames in the predetermined period and wirelessly transmits the plurality of wireless frames to the communication destination apparatus.

10 Claims, 7 Drawing Sheets

(52) U.S. Cl.
CPC .... *H03M 13/2778* (2013.01); *H03M 13/2792* (2013.01); *H04L 1/0003* (2013.01); *H04L 1/0009* (2013.01); *H04L 1/0041* (2013.01); *H04L 1/0057* (2013.01); *H04L 1/0058* (2013.01); *H04L 5/0023* (2013.01)

(58) Field of Classification Search
CPC ................ H04L 1/0003; H04L 5/0023; H03M 13/271; H03M 13/2778; H03M 13/2792; H03M 13/27
See application file for complete search history.

(56) References Cited

U.S. PATENT DOCUMENTS

| | | | |
|---|---|---|---|
| 2011/0103297 A1* | 5/2011 | Saito | H04B 7/15592 370/315 |
| 2012/0287855 A1* | 11/2012 | Kishigami | H04L 1/0071 370/328 |
| 2013/0332792 A1* | 12/2013 | Lee | H04L 27/3438 714/752 |

OTHER PUBLICATIONS

Dominik Seethaler et al., "An Efficient MMSE-Based Demodulator for MIMO Bit-Interleaved Coded Modulation", IEEE Global Telecommunications Conference, 2004, GLOBECOM'04., vol. 4, 2004, p. 2455-2459.

* cited by examiner

WIRELESS COMMUNICATION SYSTEM, WIRELESS COMMUNICATION APPARATUS AND WIRELESS COMMUNICATION METHOD

CROSS-REFERENCE TO RELATED APPLICATIONS

This application is a 371 U.S. National Phase of International Application No. PCT/JP2020/020056, filed on May 21, 2020. The entire disclosure of the above application is incorporated herein by reference.

TECHNICAL FIELD

The present disclosure relates to a wireless communication system, a wireless communication apparatus and a wireless communication method.

BACKGROUND ART

In wireless communication of the related art, a wireless communication apparatus at a transmission end interleaves and transmits data on which error correction coding has been performed (see, for example, NPL 1 and 2). Thereby, even when an error or the like occurs in a transmitted wireless signal, data can be restored normally in a wireless communication apparatus at a reception end.

CITATION LIST

Non Patent Literature

NPL 1: Jens Baltersee, Gunnar Fock, Heinrich Meyr, "Achievable Rate of MIMO Channels With Data-Aided Channel Estimation and Perfect Interleaving," IEEE Journal on Selected Areas in Communications, Vol. 19, No. 12, 2001, p. 2358-2368 NPL 2: Dominik Seethaler, Gerald Matz, Franz Hlawatsch, "An Efficient MMSE-Based Demodulator for MIMO Bit-Interleaved Coded Modulation," IEEE Global Telecommunications Conference, 2004, GLOBECOM'04., Vol. 4, 2004, p. 2455-2459

SUMMARY OF THE INVENTION

Technical Problem

In a case where interleaving has been performed, a wireless communication apparatus at a reception end receives all data blocks in a unit of error correction coding and then performs decoding, and thus latency occurs. Consequently, interleaving has been performed in a short section of several bits in the related art. However, in the case of a wireless communication system in which a bit error rate (BER) varies in a relatively long period of time, a block error occurs, and data may not be able to be restored in the wireless communication apparatus at the reception end in long interleaving in a short section as in the related art.

In view of the above-described circumstances, an object of the present disclosure is to provide a wireless communication system, a wireless communication apparatus and a wireless communication method capable of easily restoring data at a reception end even when a rate of error occurring in a wireless section varies in a long period of time.

Means for Solving the Problem

An aspect of the present disclosure is a wireless communication system including a first wireless communication apparatus and a second wireless communication apparatus, in which the first wireless communication apparatus includes an encoding unit that divides a bit string to be transmitted in a predetermined period into a plurality of blocks and performs error correction coding for each of the plurality of blocks to generate encoded data, an interleaving processing unit that performs interleaving on the encoded data to generate a transmission bit string such that bits of the encoded data which has been generated from one of the plurality of blocks are to be transmitted in a distributed manner in a period where communication quality between the first wireless communication apparatus and the second wireless communication apparatus is higher than a predetermined value in the predetermined period and in a period where the communication quality is lower than the predetermined value in the predetermined period, a modulation unit that modulates the transmission bit string which has been generated by the interleaving processing unit, and a transmission unit that divides the transmission bit string which has been modulated by the modulation unit into a plurality of wireless frames in the predetermined period and wirelessly transmits the plurality of wireless frames to the second wireless communication apparatus, and the second wireless communication apparatus includes a reception unit that receives the plurality of wireless frames which have been transmitted from the first wireless communication apparatus, a demodulation unit that demodulates the plurality of wireless frames which have been received by the reception unit, a de-interleaving processing unit that performs de-interleaving on a bit string in which results having been obtained by demodulating, by the demodulation unit, the plurality of wireless frames which have been received in the predetermined period are aligned, and a decoding unit that decodes the bit string which has been de-interleaved by the de-interleaving processing unit.

An aspect of the present disclosure is a wireless communication apparatus including an encoding unit that divides a bit string to be transmitted to a communication destination apparatus which is a wireless communication apparatus at a communication destination in a predetermined period into a plurality of blocks and performs error correction coding for each of the plurality of blocks to generate encoded data, an interleaving processing unit that performs interleaving on the encoded data to generate a transmission bit string such that bits of the encoded data which has been generated from one of the plurality of blocks are to be transmitted in a distributed manner in a period where communication quality between the wireless communication apparatus and the communication destination apparatus is higher than a predetermined value in the predetermined period and in a period where the communication quality is lower than the predetermined value in the predetermined period, a modulation unit that modulates the transmission bit string which has been generated by the interleaving processing unit, and a transmission unit that divides the transmission bit string which has been modulated by the modulation unit into a plurality of wireless frames in the predetermined period and wirelessly transmits the plurality of wireless frames to the communication destination apparatus.

An aspect of the present disclosure is a wireless communication apparatus including a reception unit that receives wireless frames wirelessly transmitted from a communication destination apparatus, the communication destination apparatus being a wireless communication apparatus at a communication destination, a demodulation unit that demodulates the wireless frames which have been received by the reception unit, a de-interleaving processing unit that performs de-interleaving on a bit string such that bits which have been transmitted from the communication destination apparatus in a distributed manner in a period where communication quality between the wireless communication apparatus and the communication destination apparatus is higher than a predetermined value in the predetermined period and in a period where the communication quality is lower than the predetermined value in the predetermined period are included in one block that is a unit of decoding processing, the bit string being a bit string in which results having been obtained by demodulating, by the demodulation unit, the plurality of wireless frames which have been received in the predetermined period are aligned, and a decoding unit that decodes the bit string which has been de-interleaved by the de-interleaving processing unit for each block.

An aspect of the present disclosure is a wireless communication method in a wireless communication system including a first wireless communication apparatus and a second wireless communication apparatus, the wireless communication method including an encoding step of, by the first wireless communication apparatus, dividing a bit string to be transmitted in a predetermined period into a plurality of blocks and performing error correction coding for each of the plurality of blocks to generate encoded data, an interleaving processing step of, by the first wireless communication apparatus, performing interleaving on the encoded data to generate a transmission bit string such that bits of the encoded data which has been generated from one of the plurality of blocks are to be transmitted in a distributed manner in a period where communication quality between the first wireless communication apparatus and the second wireless communication apparatus is higher than a predetermined value in the predetermined period and in a period where the communication quality is lower than the predetermined value in the predetermined period, a modulation step of, by the first wireless communication apparatus, modulating the transmission bit string which has been generated in the interleaving processing step, a transmission step of, by the first wireless communication apparatus, dividing the transmission bit string which has been modulated in the modulation step into a plurality of wireless frames in the predetermined period and wirelessly transmitting the plurality of wireless frames to the second wireless communication apparatus, a reception step of, by the second wireless communication apparatus, receiving the plurality of wireless frames which have been transmitted from the first wireless communication apparatus, a demodulation step of, by the second wireless communication apparatus, demodulating the plurality of wireless frames which have been received in the reception step, a de-interleaving processing step of, by the second wireless communication apparatus, performing de-interleaving on a bit string in which results having been obtained by demodulating, in the demodulation step, the plurality of wireless frames which have been received in the predetermined period are aligned, and a decoding step of, by the second wireless communication apparatus, decoding the bit string which has been de-interleaved in the de-interleaving processing step.

An aspect of the present disclosure is a wireless communication method including an encoding step of dividing a bit string to be transmitted to a communication destination apparatus which is a wireless communication apparatus at a communication destination in a predetermined period into a plurality of blocks and performing error correction coding for each of the plurality of blocks to generate encoded data, an interleaving processing step of performing interleaving on the encoded data to generate a transmission bit string such that bits of the encoded data which has been generated from one of the plurality of blocks are to be transmitted in a distributed manner in a period where communication quality between the wireless communication apparatus and the communication destination apparatus is higher than a predetermined value in the predetermined period and in a period where the communication quality is lower than the predetermined value in the predetermined period, a modulation step of modulating the transmission bit string which has been generated in the interleaving processing step, and a transmission step of dividing the transmission bit string which has been modulated in the modulation step into a plurality of wireless frames in the predetermined period and wirelessly transmitting the plurality of wireless frames to the communication destination apparatus.

An aspect of the present disclosure is a wireless communication method including a reception step of receiving wireless frames wirelessly transmitted from a communication destination apparatus, the communication destination apparatus being a wireless communication apparatus at a communication destination, a demodulation step of demodulating the wireless frames which have been received in the reception step, a de-interleaving processing step of performing de-interleaving on a bit string such that bits which have been transmitted from the communication destination apparatus in a distributed manner in a period where communication quality between the wireless communication apparatus and the communication destination apparatus is higher than a predetermined value in the predetermined period and in a period where the communication quality is lower than the predetermined value in the predetermined period are included in one block that is a unit of decoding processing, the bit string being a bit string in which results having been obtained by demodulating, in the demodulation step, the plurality of wireless frames which have been received in the predetermined period are aligned, and a decoding step of decoding the bit string which have been de-interleaved in the de-interleaving processing step for each block.

Effects of the Invention

According to the present disclosure, it is possible to easily restore data at a reception end even when a rate of error occurring in a wireless section varies in a long period of time.

DESCRIPTION OF EMBODIMENTS

Hereinafter, embodiments of the present disclosure will be described in detail with reference to the drawings.

First Embodiment

Figure 1:
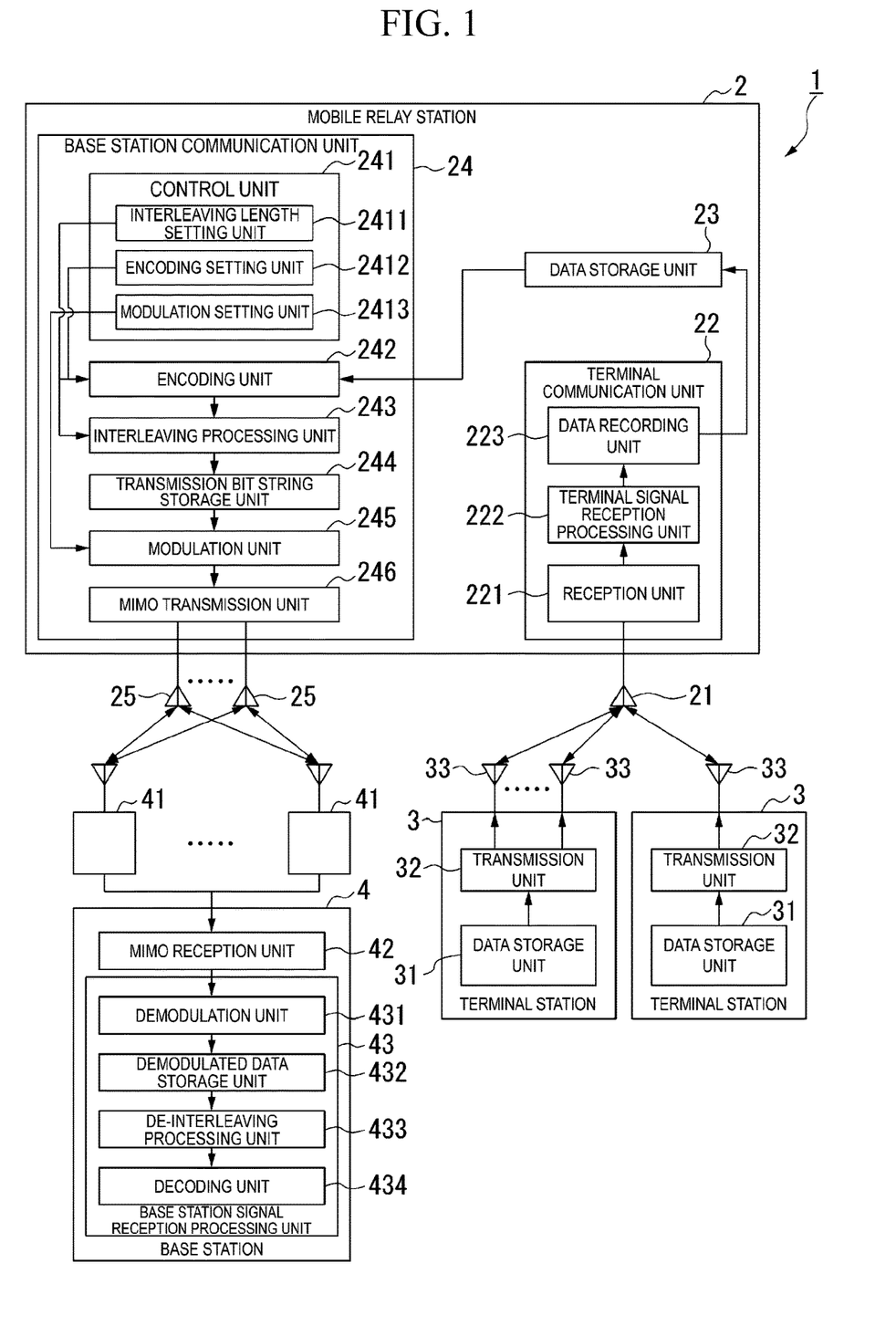
FIG. 1 is a configuration diagram of a wireless communication system according to a first embodiment of the present disclosure.

FIG. 1 is a configuration diagram of a wireless communication system 1 according to a first embodiment. The wireless communication system 1 includes a mobile relay station 2, a terminal station 3, and a base station 4. The number of the mobile relay stations 2, the number of the terminal stations 3, and the number of the base stations 4 included in the wireless communication system 1 can be freely determined, and the number of the terminal stations 3 is assumed to be large.

The mobile relay station 2 is an example of a wireless communication apparatus mounted on a moving body. The mobile relay station 2 is provided in, for example, a low earth orbit (LEO) satellite. The altitude of the LEO satellite is 2000 km or less, and the LEO satellite orbits the sky of the Earth once in approximately 1.5 hours. The terminal stations 3 and the base station 4 are installed on the Earth, such as on the ground or at sea. Each terminal station 3 is, for example, an IoT terminal. The terminal station 3 collects data such as environment data detected by a sensor and wirelessly transmits the collected data to the mobile relay station 2. FIG. 1 illustrates only two terminal stations 3. The mobile relay station 2 receives the data wirelessly transmitted from each of the plurality of terminal stations 3 while moving in the sky of the Earth, and wirelessly transmits the received data to the base station 4. The base station 4 receives the data collected by the terminal stations 3 from the mobile relay station 2.

As the mobile relay station, it is conceivable to use a relay station mounted on an unmanned aerial vehicle such as a geostationary orbit satellite, a drone, or a high altitude platform station (HAPS). However, in the case of a relay station mounted on a geostationary orbit satellite, a coverage area on the ground (footprint) is wide, but an altitude thereof is high, and thus a link budget for an IoT terminal installed on the ground is extremely small. On the other hand, in the case of a relay station mounted on a drone or an HAPS, a link budget is high, but a coverage area is narrow. Further, a drone requires a battery, and an HAPS requires a solar panel. In the present embodiment, the mobile relay station 2 is mounted on a LEO satellite. Thus, in addition to a link budget falling within a limit, the LEO satellite, which orbits outside the atmosphere, has no air resistance and less fuel consumption. In addition, a footprint is also large as compared to a case where a relay station is mounted on a drone or an HAPS.

However, the mobile relay station 2 mounted on the LEO performs communication while moving at high speed. Specifically, when viewed from the ground, the mobile relay station 2 passes through the sky above for approximately 10 minutes. When paying attention to communication between the mobile relay station 2 and the base station 4, the quality of wireless communication between the mobile relay station 2 and the base station 4 on the ground is good when the mobile relay station 2 is in a line of sight from the base station 4, and is reduced when the mobile relay station 2 is not in a line of sight from the base station 4. The mobile relay station 2 orbits around the Earth in the sky, and thus the communication quality varies periodically. That is, wireless BER characteristics between the mobile relay station 2 and the base station 4 vary with time, and there is a possibility that a signal transmitted from the mobile relay station 2 has a block error in the base station 4 in a time slot in which the mobile relay station 2 is not in a line of sight from the base station 4.

The mobile relay station 2 of the present embodiment accumulates a large amount of information received from the plurality of terminal stations 3 and then transmits the information to the base station 4. Thus, the mobile relay station 2 can perform transmission processing in units of a set of bit strings to be transmitted in a period which is long to a certain extent without performing transmission processing on each bit string representing accumulated information one by one. Consequently, the mobile relay station 2 divides bit strings representing information to be transmitted in the long period into a plurality of blocks and performs error correction coding for each of the plurality of blocks. In addition, the mobile relay station 2 performs interleaving on all encoded data generated from the plurality of blocks on a bit-by-bit basis such that the bits of the encoded data generated from one block are to be transmitted in a distributed manner in a period having communication quality higher than a predetermined value and in a period having communication quality lower than the predetermined value, and transmits the interleaved data to the base station 4. Even when block errors occur in some signals received in a period having low communication quality and a portion of a bit string transmitted from the mobile relay station 2 cannot be restored, the base station 4 de-interleaves a bit string that can be restored, thereby obtaining a bit string in which errors are distributed. This makes all BER rates close to each other, and thus reduces the overall block error rate. Because the errors are distributed, the base station 4 can decode the original information.

Next, configurations of respective apparatuses will be described.

The mobile relay station 2 illustrated in FIG. 1 includes one or more antennas 21, a terminal communication unit 22, a data storage unit 23, a base station communication unit 24, and a plurality of antennas 25.

The terminal communication unit 22 includes a reception unit 221, a terminal signal reception processing unit 222, and a data recording unit 223. The reception unit 221 receives terminal uplink signals transmitted by the terminal stations 3 by the antennas 21. The terminal signal reception processing unit 222 performs reception processing of the terminal uplink signals. In the reception processing, the terminal uplink signals received by the reception unit 221 are demodulated and decoded, and terminal transmission data transmitted by the terminal stations 3 is obtained. The data recording unit 223 writes the terminal transmission data obtained by the reception processing in the data storage unit 23.

The base station communication unit 24 transmits the terminal transmission data stored in the data storage unit 23 to the base station 4 by multiple input multiple output (MIMO). The base station communication unit 24 includes a control unit 241, an encoding unit (encoder) 242, an interleaving processing unit (interleaver) 243, a transmission bit string storage unit 244, a modulation unit (modulator) 245, and a MIMO transmission unit (transmitter) 246.

The control unit 241 controls each unit in the base station communication unit 24. The control unit 241 includes an interleaving length setting unit 2411, an encoding setting unit (encoding setter) 2412, and a modulation setting unit (modulation setter) 2413.

The interleaving length setting unit 2411 sets an interleaving length in the encoding unit 242. The interleaving length is the length of a period which is a unit for performing interleaving.

The encoding setting unit 2412 sets the type of error correction code to be used in the encoding unit 242. The type of error correction code may be forward error correction (FEC) such as a Hamming code, a Reed-Solomon code, a low density paper check (LDPC) code, a turbo code, or the like, but is not limited thereto. In addition, the encoding setting unit 2412 sets an encoding rate of error correction coding in the encoding unit 242. The encoding setting unit 2412 may set the type and encoding rate of an error correction code for each block on which error correction coding is to be performed.

The modulation setting unit 2413 sets a modulation scheme to be used in the modulation unit 245. For example, the modulation setting unit 2413 instructs a modulation scheme having a multilevel number corresponding to predicted communication quality at the transmission time. Note that the predicted communication quality is calculated in advance based on orbit information of the LEO satellite and the position of each antenna station 41. The orbit information of the LEO is information with which the position, speed, moving direction, and the like of the LEO satellite at any time can be obtained. The modulation setting unit 2413 indicates, for example, a modulation scheme having a smaller multilevel number as predicted communication quality becomes lower, and indicates a modulation scheme having a larger multilevel number as predicted communication quality becomes higher.

The encoding unit 242 reads terminal transmission data transmitted in a period of an interleaving length set by the interleaving length setting unit 2411 from the data storage unit 23. The encoding unit 242 divides bit strings representing the read terminal transmission data into a plurality of encoding blocks. In the present embodiment, a case where each encoding block is constituted by adjacent bit strings is described, but non-adjacent bits may be included in one encoding block. The encoding unit 242 performs error correction coding for each of the encoding blocks to generate encoded data. At this time, the encoding unit 242 performs error correction coding using the error correction code and the encoding rate which are set by the encoding setting unit 2412.

The interleaving processing unit 243 performs interleaving on the encoded data, which has been generated by the encoding unit 242, on a bit-by-bit basis. At this time, the interleaving processing unit 243 performs interleaving such that, for some or all of the encoding encoding blocks, bits of the encoded data generated from each of the encoding blocks are to be transmitted in a distributed manner in a period having communication quality higher than a predetermined value and in a period having communication quality lower than the predetermined value in a period of an interleaving length. The transmission bit string storage unit 244 stores transmission bit strings generated by the interleaving processing unit 243 performing interleaving on the encoded data string.

The modulation unit 245 reads the transmission bit string stored in the transmission bit string storage unit 244 in order from the head, converts the read bit string into parallel signals, and then modulates the parallel signals according to the modulation scheme which is set by the modulation setting unit 2413. The MIMO transmission unit 246 applies weights indicated by the control unit 241 to wireless frames in which the parallel signals modulated by the modulation unit 245 are set to generate a base station downlink signal to be transmitted from each antenna 25. Note that the weights are calculated in advance based on the orbit information of the LEO satellite and the position of each antenna station 41. The MIMO transmission unit 246 transmits the generated base station downlink signals from the antennas 25 using MIMO.

The terminal station 3 includes a data storage unit 31, a transmission unit 32, and one or a plurality of antennas 33. The data storage unit 31 stores sensor data and the like. The transmission unit 32 reads the sensor data from the data storage unit 31 as terminal transmission data, and wirelessly transmits a terminal uplink signal having the read terminal transmission data set therein from the antennas 33. The transmission unit 32 transmits the signal by, for example, low power wide area (LPWA). In addition, the transmission unit 32, as well as the other terminal stations 3, may perform transmission by time division multiplexing, orthogonal frequency division multiplexing (OFDM), MIMO, or the like.

The base station 4 includes the plurality of antenna stations 41, a MIMO reception unit (receiver) 42, and a base station signal reception processing unit 43.

Each antenna station 41 is disposed at a position separated from the other antenna stations 41 so that a difference between arrival angles of signals from the plurality of antennas 25 of the mobile relay station 2 increases. Each of the antenna stations 41 converts the base station downlink signals received from the mobile relay station 2 into an electrical signal and outputs the electrical signal to the MIMO reception unit 42.

The MIMO reception unit 42 aggregates the base station downlink signals received from the plurality of antenna stations 41. The MIMO reception unit 42 multiplies the base station downlink signal input from each of the antenna stations 41 by a weight and synthesizes received signals multiplied by the weights. The weights are calculated in advance based on the orbit information of the LEO satellite and the position of each of the antenna stations 41.

The base station signal reception processing unit 43 performs reception processing on the received signal synthesized by the MIMO reception unit 42 to obtain terminal transmission data transmitted from the terminal station 3. The base station signal reception processing unit 43 includes a demodulation unit (demodulator) 431, a demodulated data storage unit 432, a de-interleaving processing unit (de-interleaver) 433, and a decoding unit (decoder) 434. The demodulation unit 431 demodulates the received signal synthesized by the MIMO reception unit 42. The demodulated data storage unit 432 stores demodulated data obtained by the demodulation unit 34 demodulating the received signal. The de-interleaving processing unit 433 reads the demodulated data for a period of an interleaving length from the demodulated data storage unit 432 and performs de-interleaving. At this time, the de-interleaving processing unit 433 performs de-interleaving such that bits transmitted from the mobile relay station 2 in a distributed manner in a period having communication quality higher than a predetermined value and in a period having communication quality lower than the predetermined value in a period of an interleaving length are included in one decoding processing block. The decoding processing block is a bit string which is a unit for performing decoding processing. The decoding unit 434 decodes the de-interleaved demodulated data for each of the decoding processing blocks to obtain terminal transmission data.

Figure 2:
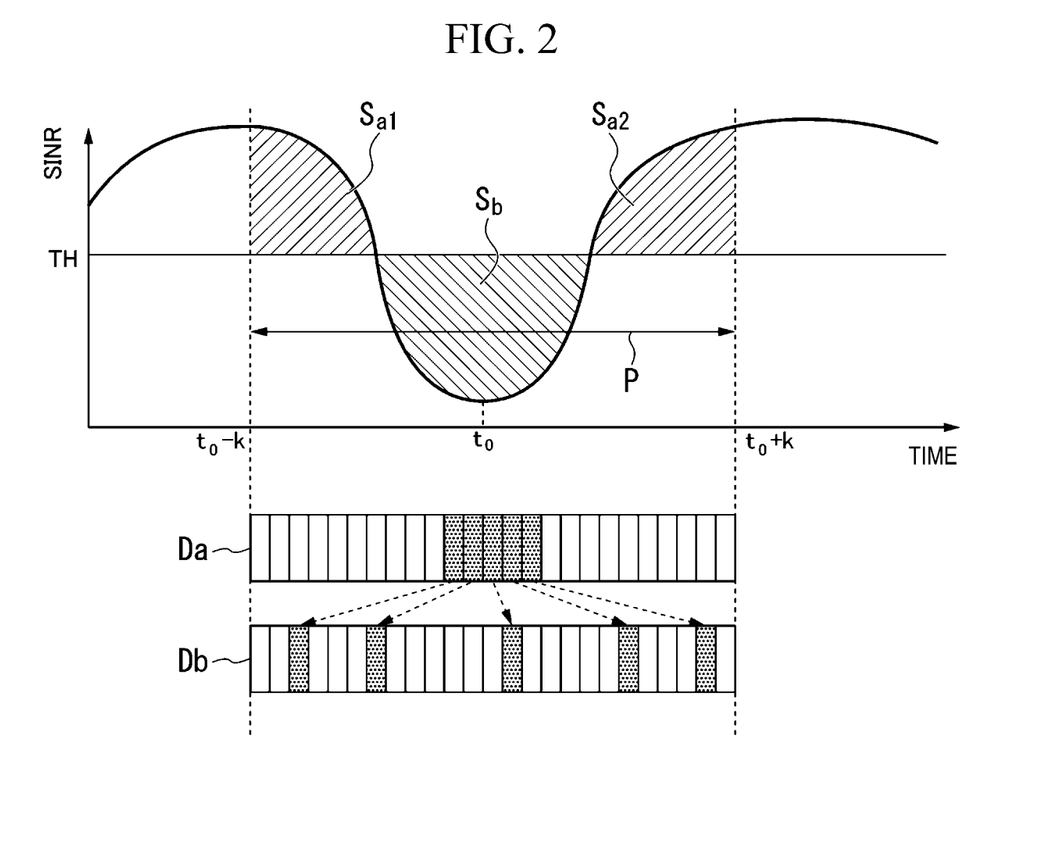
FIG. 2 is a diagram illustrating a temporal change in an SINR between a mobile relay station and a base station according to the first embodiment.

FIG. 2 is a diagram illustrating a temporal change in a signal to interference and noise ratio (SINR) between the mobile relay station 2 and the base station 4. The SINR is one index representing communication quality. The mobile relay station 2 orbits around the Earth in the sky, and thus an SINR between the mobile relay station 2 and the base station 4 varies periodically. Accordingly, the transmission capacity between the mobile relay station 2 and the base station 4 varies periodically similar to the SINR. That is, the higher the SINR, the larger the transmission capacity, and the lower the SINR, the smaller the transmission capacity. The cycle of the variation will be referred to as a path.

A BER of data transmitted from the mobile relay station 2 deteriorates when the SINR is low. Consequently, the mobile relay station 2 performs error correction coding for each of the encoding blocks into which the bit strings to be transmitted to the base station 4 are divided, interleaves a bit string of encoded data to be transmitted in a period of an interleaving length which is long to a certain extent, and then transmits the interleaved bit string to the base station 4. For this reason, even when block errors occur in some signals received in a period having low communication quality, and a portion of a bit string Da cannot be restored in the base station 4, a bit string Db in which errors are distributed is obtained by de-interleaving the bit string Da. Thereby, bits having a BER of low communication quality are distributed, and thus the base station 4 can restore data transmitted by the mobile relay station 2.

On the other hand, when an interleaving length in the mobile relay station 2 is excessively long, a delay increases. Furthermore, the amount of storage for storing data increases in both the mobile relay station 2 and the base station 4, and thus the cost of the apparatuses increases. Consequently, by determining an interleaving length as will be described below, BER characteristics are effectively improved while an interleaving length is reduced as much as possible.

The SINR after demodulation varies periodically as illustrated in FIG. 2. The variation in the SINR can be predicted from the orbit information of the LEO satellite and the position of the base station 4. Consequently, a timing at which the SINR is lowest is determined to be time $t_0$. Note that a timing at which the SINR is highest may be determined to be time $t_0$. In addition, a period is extended on both sides with the time $t_0$ as the center. That is, a period of time ranges from time $t_0-k$ to time $t_0+k$ (k is a real number). Further, in a graph representing a variation in the SINR, a period P when an area $S_a$ ($=S_{a1}+S_{a2}$) of a portion exceeding a threshold value TH and an area $S_b$ below the threshold value TH are at a predetermined ratio is determined to be an interleaving length. For example, the predetermined ratio is 1:1. Thereby, an effect can be obtained with a minimum interleaving length.

Operations of the wireless communication system 1 will be described.

Figure 3:
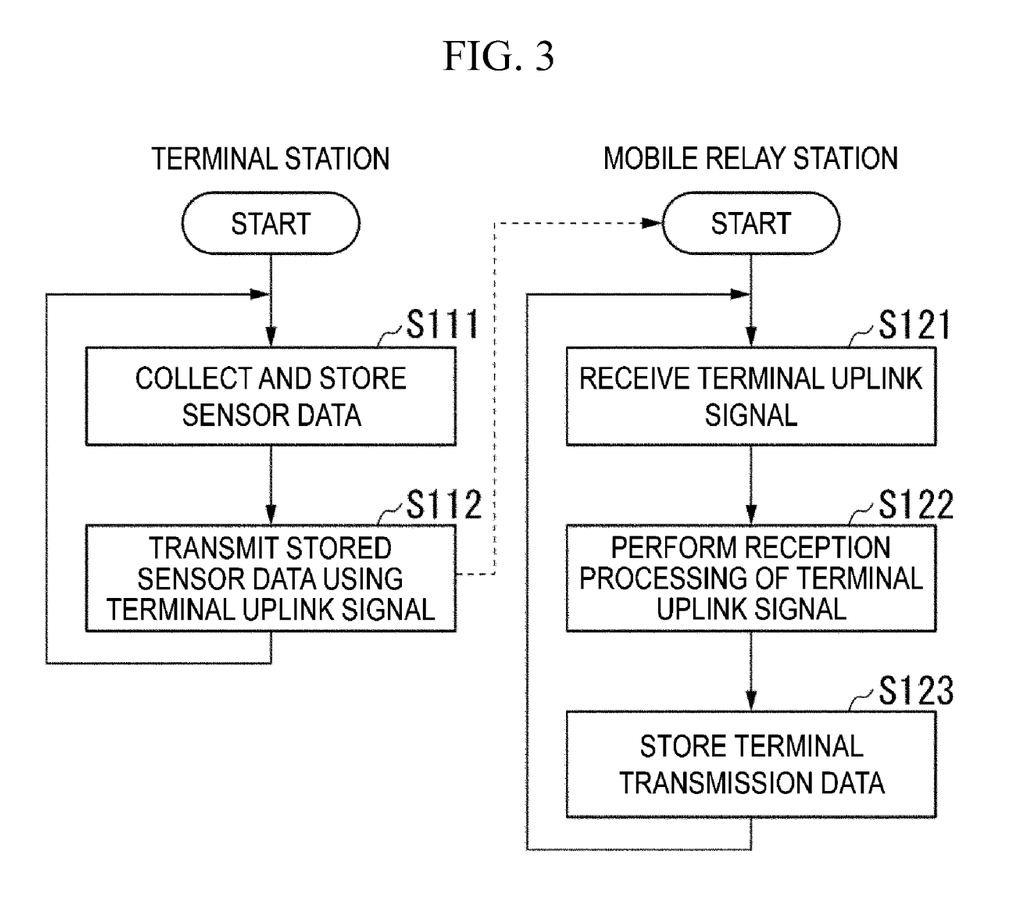
FIG. 3 is a flowchart illustrating processing of the wireless communication system according to the first embodiment.

FIG. 3 is a flowchart illustrating processing of the wireless communication system 1 in a case where an uplink signal is transmitted from the terminal station 3. Each terminal station 3 acquires data detected by a sensor, which is not illustrated and provided outside or inside the terminal station 3 at any time, and writes the acquired data in the data storage unit 31. The transmission unit 32 reads the sensor data from the data storage unit 31 as terminal transmission data. The transmission unit 32 wirelessly transmits a terminal uplink signal having the terminal transmission data set therein from the antennas 33 (step S112). The terminal station 3 repeats the processing from step S111.

The reception unit 221 of the mobile relay station 2 receives the terminal uplink signal transmitted from the terminal station 3 (step S121). The terminal signal reception processing unit 222 performs demodulation and decoding of the terminal uplink signal received in step S121 to obtain terminal transmission data (step S122). The data recording unit 223 writes the terminal transmission data in the data storage unit 23 (step S123). The mobile relay station 2 repeats the processing from step S121.

Figure 4:
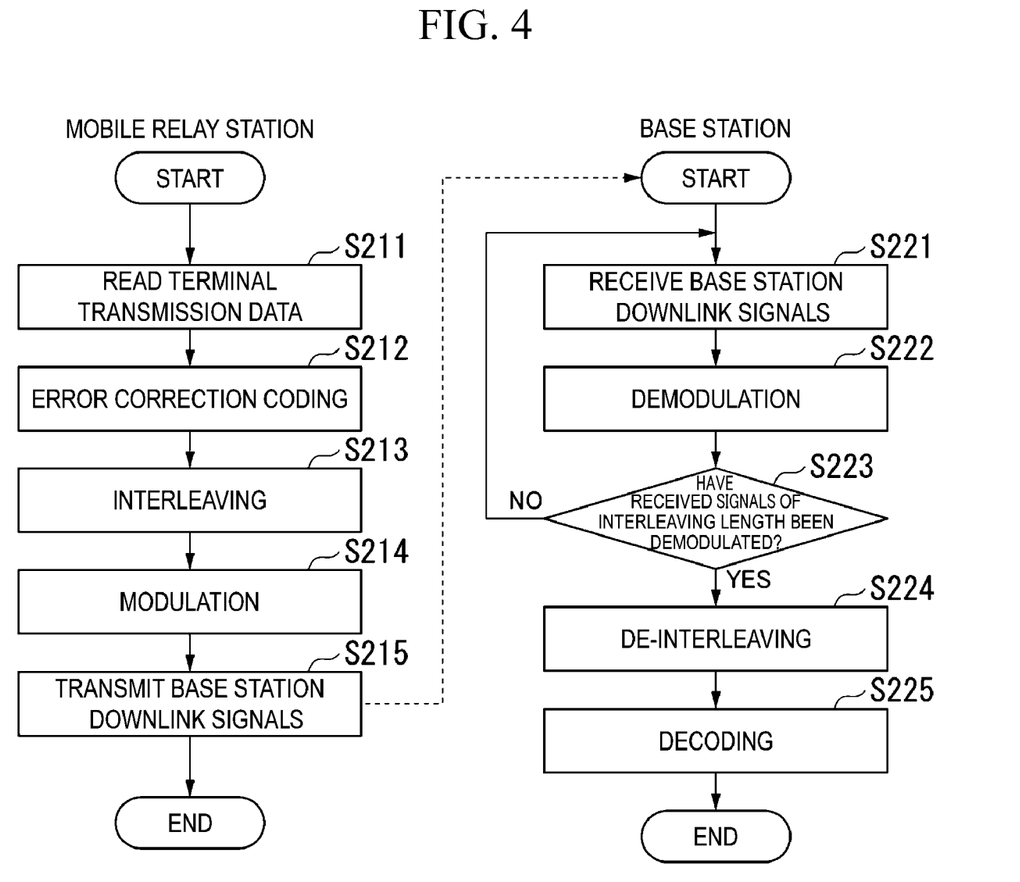
FIG. 4 is a flowchart illustrating processing of the wireless communication system according to the first embodiment.

FIG. 4 is a flowchart illustrating processing of the wireless communication system 1 in a case where a base station downlink signals are transmitted from the mobile relay station 2. The wireless communication system 1 performs the processing illustrated in FIG. 4 for each period of an interleaving length.

The encoding unit 242 of the mobile relay station 2 reads the terminal transmission data to be transmitted in the period of the interleaving length from the data storage unit 23 (step S211). The encoding unit 242 divides bit strings representing the read terminal transmission data into a plurality of encoding blocks and performs error correction coding for each of the encoding blocks to generate encoded data (step S212). The interleaving processing unit 243 interleaves the bit string of the encoded data generated in step S212 and writes transmission bit string obtained by the interleaving in the transmission bit string storage unit 244 (step S213).

The modulation unit 245 reads the transmission bit string from the transmission bit string storage unit 244 in order from the head, converts the read transmission bit string into parallel signals, and then modulates the parallel signals (step S214). The MIMO transmission unit 246 performs weighting on wireless frames having the modulated parallel signals set therein to generate a base station downlink signal to be transmitted from each antenna 25. The MIMO transmission unit 246 transmits the generated base station downlink signals from the antennas 25 by MIMO (step S215).

The antenna stations 41 of the base station 4 receive the base station downlink signals from the mobile relay station 2 (step S221). Each antenna station 41 outputs a received signal obtained by converting the received base station downlink signals into an electrical signal to the MIMO reception unit 42. The MIMO reception unit 42 synchronizes timings of the received signals received from the antenna stations 41. The MIMO reception unit 42 multiplies the received signals received by the antenna stations 41 by weights and adds the received signals up. The demodulation unit 431 of the base station signal reception processing unit 43 demodulates the added received signal and writes demodulated data obtained by the demodulation in the demodulated data storage unit 432 (step S222). The base station 4 repeats the processing from step S221 until the received signals for a period of an interleaving length are received (step S223: NO).

In a case where the base station 4 demodulates the received signals for the period of the interleaving length (step S223: YES), the de-interleaving processing unit 433 reads the demodulated data for the period of the interleaving length from the demodulated data storage unit 432 and de-interleaves the read demodulated data (step S224). The decoding unit 434 decodes the de-interleaved demodulated data for each of the decoding processing blocks to obtain terminal transmission data (step S225). The base station 4 repeats the processing from step S221.

Figure 5:
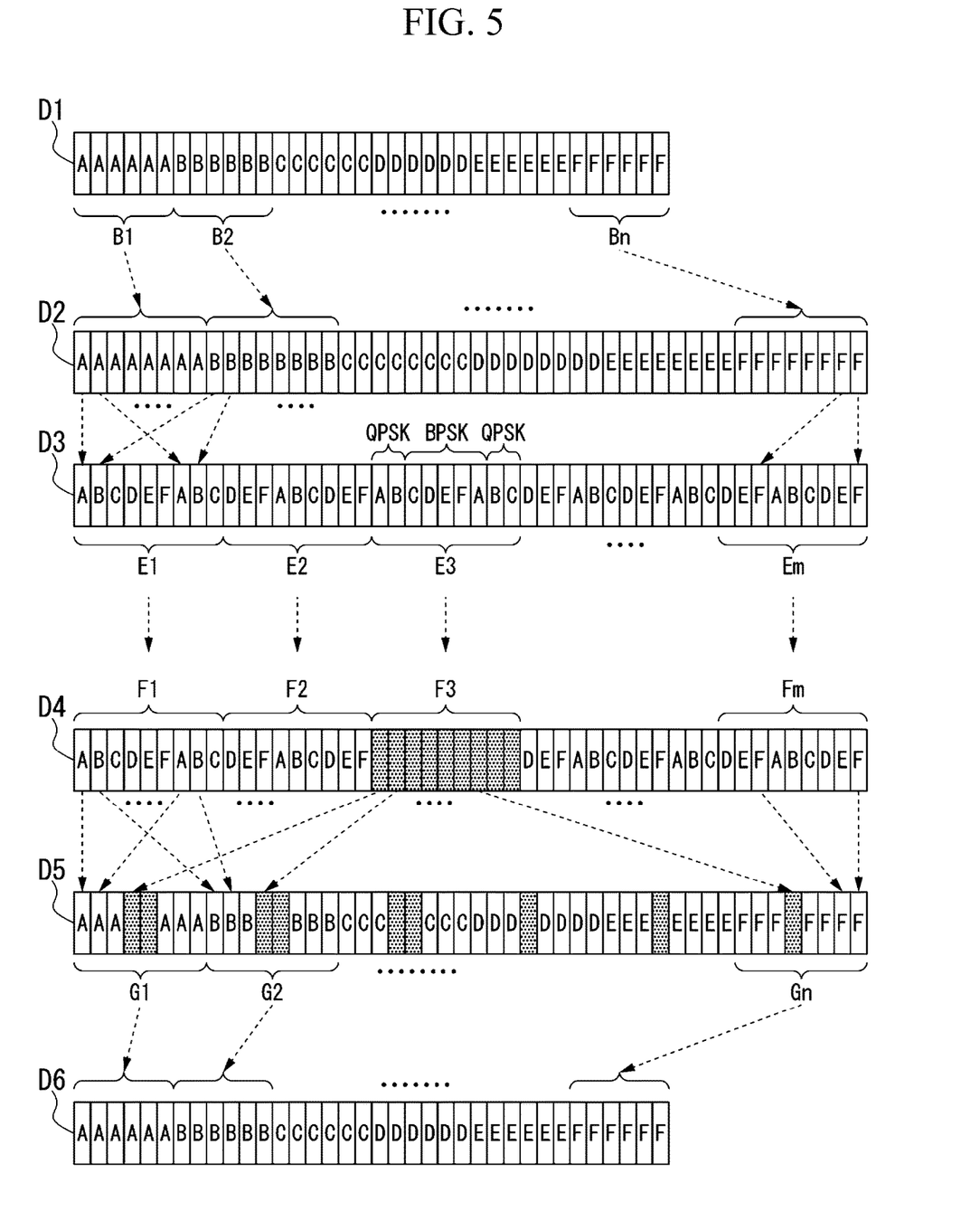
FIG. 5 is a diagram illustrating transmission processing of the mobile relay station and reception processing of the base station according to the first embodiment.

FIG. 5 is a diagram illustrating transmission processing of base station downlink signals in the mobile relay station 2 and reception processing of base station downlink signals in the base station 4. For the purpose of simplification, in FIG.

Figure 6:
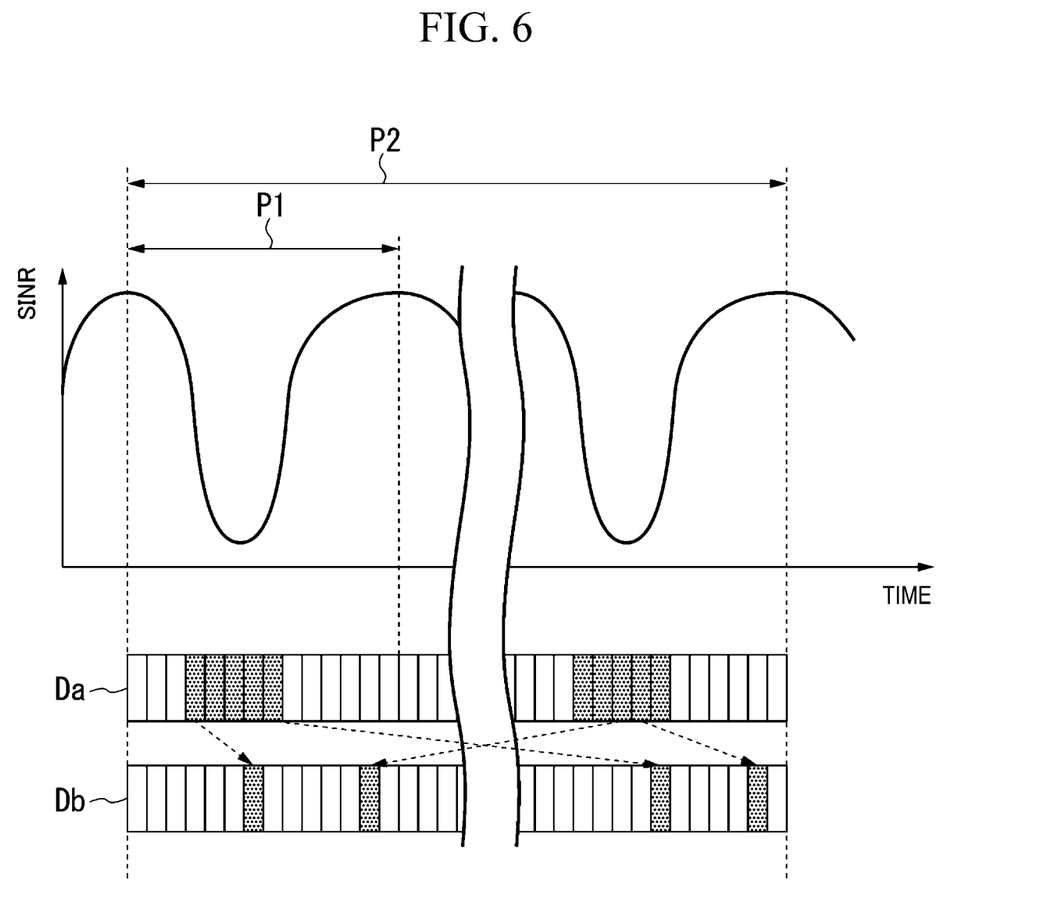
FIG. 6 is a diagram illustrating changes in SINRs of a plurality of paths according to a second embodiment.

5, the number of bits of data transmitted for a period of an interleaving length is small, as in FIG. 2 and FIG. 6 to be described below.

The encoding unit 242 reads terminal transmission data D1 to be transmitted in a period of an interleaving length from the data storage unit 23 (step S211 in FIG. 4). The encoding unit 242 divides the terminal transmission data D1 into encoding blocks B1, B2, . . . , and Bn from the head and performs error correction coding on each encoding block Bi (i=1, 2, . . . n) with the type and encoding rate of error correction code which are set by the encoding setting unit 2412 to generate encoded data D2 (step S212 in FIG. 4). The length of each encoding block Bi can be freely determined according to the type of error correction code, or the like.

The interleaving processing unit 243 performs interleaving on the encoded data D2 on a bit-by-bit basis to obtain a transmission bit string D3 (step S213 in FIG. 4). The modulation unit 245 reads bit strings E1, E2, . . . , and Em in order from the head of the transmission bit string D3. The length of each bit string Ej (j=1, 2, . . . , m) is a bit length corresponding to a modulation scheme set in the modulation unit 245 by the modulation setting unit 2413 based on a predicted communication quality at a time when the bit string Ej is to be transmitted, or a bit length corresponding to the length of a wireless frame. The modulation unit 245 converts the read bit string Ej into parallel signals, each of the parallel signals corresponding to each of the antennas 25, and modulates each of the parallel signals by a modulation scheme which is set by the modulation setting unit 2413 (step S214 in FIG. 4). For example, in a case where a threshold value TH2 represents a lower communication quality than a threshold value TH1, the modulation setting unit 2413 sets QPSK for a period in which communication quality lower than the threshold value TH1 and higher than the threshold value TH2 is predicted and sets BPSK for a period in which communication quality lower than the threshold value TH2 is predicted.

The MIMO transmission unit 246 performs weighting on wireless frames for which modulated parallel signals are set to generate base station downlink signals transmitted from the antennas 25. The MIMO transmission unit 246 transmits the generated base station downlink signals from the corresponding antennas 25 by MIMO (step S215 in FIG. 4). Thereby, in the period of the interleaving length, the bit strings E1 to Em are transmitted using the base station downlink signals.

The demodulation unit 431 of the base station 4 writes demodulated data Fj obtained by demodulating the received signal for which the bit string Ej is set, in the demodulated data storage unit 432 (step S222 in FIG. 4). For example, the received signal received around the time $t_0$ illustrated in FIG. 2 has a low communication quality, and thus the received signal may not be able to be normally demodulated. After demodulation results F1 to Fm of the received signals in the period of the interleaving length are written in the demodulated data storage unit 432, the de-interleaving processing unit 433 de-interleaves demodulated data D4 in which the demodulation results F1 to Fm are aligned to obtain a bit string D5 (step S224 in FIG. 4). The decoding unit 434 decodes the bit string D5 for each of decoding processing blocks G1, G2, . . . , and Gn to obtain data D6 in which bit strings obtained by the decoding are aligned (step S225 in FIG. 4). The data D6 represents terminal transmission data.

The related-art interleaving technique has been performed in a short section of several bits, and thus it is not inevitable that correction capability deteriorates in a case where a BER deteriorates in a long section. In the present embodiment, deterioration of correction capability can be suppressed in a channel having a relatively longer variation cycle than a frame length of a signal, such as a case where deterioration of a BER varies in minutes to hours.

Note that in a case where the type and encoding rate of an error correction code which are set in the encoding unit 242 are fixed, the control unit 241 does not need to include the encoding setting unit 2412. In a case where a demodulation scheme in the modulation unit 245 is fixed, the control unit 241 does not need to include the modulation setting unit 2413. In addition, the mobile relay station 2 may set the type and encoding rate of an error correction code being used, and a modulation scheme in a base station downlink signal and notify the base station 4.

Further, in a case where the interleaving length setting unit 2411 determines that the amount of terminal transmission data to be transmitted to the base station 4 is so small that downlink transmission does not need to be performed at all times, the interleaving length setting unit 2411 may instruct the interleaving processing unit 243 not to perform interleaving. The interleaving length setting unit 2411 instructs the modulation unit 245 and the MIMO transmission unit 246 to transmit terminal transmission data in a period having high transmission capacity characteristics. On the other hand, the interleaving length setting unit 2411 instructs the interleaving processing unit 243 to perform interleaving in a case where the amount of data of terminal transmission data to be transmitted to the base station 4 is so large that downlink transmission needs to be performed even in a period in which communication quality is lower than a predetermined value.

Second Embodiment

In the present embodiment, an interleaving length is determined in accordance with a path. FIG. 6 is a diagram illustrating changes in SINRs of a plurality of paths. A mobile relay station 2 can set an interleaving length to be a period P1 of one path or a period P2 of a plurality of paths. In a case where an interleaving length is set to be the period P2 of the plurality of paths, even when block errors occur in some signals received by the base station 4 in a period having a low communication quality of each path, and a portion of the bit string Da cannot be demodulated, a bit string Db in which errors are distributed over a plurality of paths is obtained by de-interleaving a bit string Da. In this manner, an interleaving length is over a period of a plurality of orbits of a LEO satellite, and thus BER deterioration can be dispersed as compared to a case where an interleaving length is set to be a period of one path. Thereby, it is possible to improve characteristics even when there is a path in which an SINR is not likely to be improved depending on the orbit of the LEO satellite. In addition, the interleaving length may be a length to which periods of paths of a plurality of the mobile relay stations 2 are added.

Third Embodiment

In the present embodiment, the mobile relay station 2 communicates with the base station 4 in a wireless manner by one antenna. Hereinafter, differences from the first and second embodiments will be mainly described.

Figure 7:
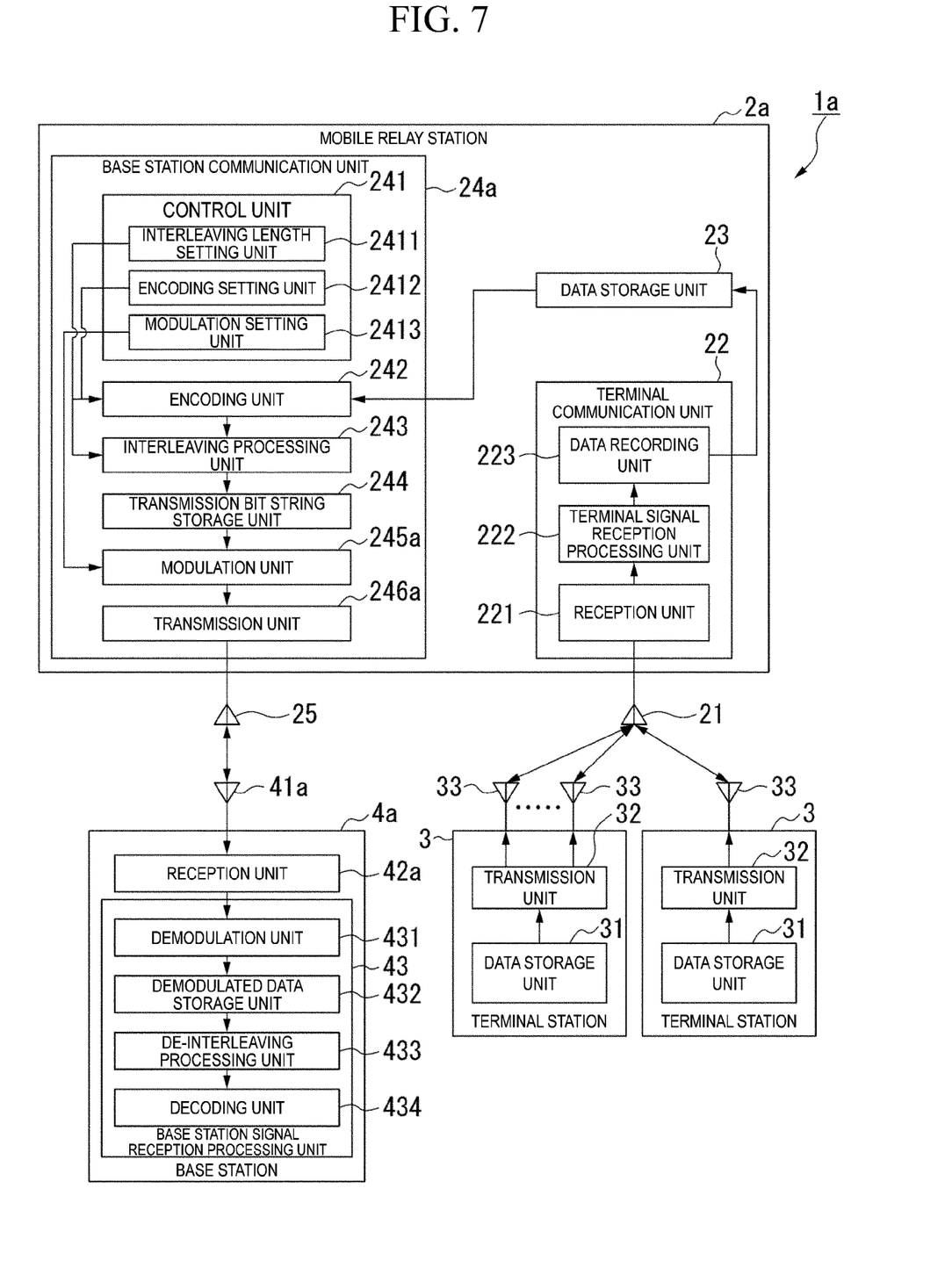
FIG. 7 is a configuration diagram of a wireless communication system according to a third embodiment.

FIG. 7 is a configuration diagram of a wireless communication system 1a according to a third embodiment. In the drawing, the same components as those of the wireless communication system 1 according to the first embodiment illustrated in FIG. 1 are denoted by the same reference numerals and signs, and description thereof will be omitted. The wireless communication system 1a includes a mobile relay station 2a, a terminal station 3, and a base station 4a.

The mobile relay station 2a includes one or more antennas 21, a terminal communication unit 22, a data storage unit 23, a base station communication unit 24a, and one antenna 25. The base station communication unit 24a includes a control unit 241, an encoding unit 242, an interleaving processing unit 243, a transmission bit string storage unit 244, a modulation unit 245a, and a transmission unit 246a. The modulation unit 245a reads a transmission bit string stored in the transmission bit string storage unit 244 in order from the head and modulates the read bit string by a modulation scheme set by a modulation setting unit 2413. The transmission unit 246a converts wireless frames in which signals modulated by the modulation unit 245a are set from electrical signals into wireless signals and transmits the wireless signals from the antenna 25.

The base station 4a includes an antenna 41a, a reception unit 42a, and a base station signal reception processing unit 43. The reception unit 42a converts the terminal downlink signals received by the antenna 41a into electrical signals and outputs the electrical signals to a demodulation unit 431.

Note that, in the above-described embodiments, a case where the mobile relay station 2 performs interleaving, and the base station 4 performs de-interleaving has been described, but the terminal station 3 may perform interleaving, and the mobile relay station 2 may perform de-interleaving. In this case, the transmission unit 32 of the terminal station 3 includes the control unit 241, the encoding unit 242, the interleaving processing unit 243, the transmission bit string storage unit 244, the modulation unit 245, and the MIMO transmission unit 246, and the terminal signal reception processing unit 222 of the mobile relay station 2 includes the demodulation unit 431, the demodulated data storage unit 432, the de-interleaving processing unit 433, and the decoding unit 434. In addition, the reception unit 221 of the mobile relay station 2 performs the same processing as that of the MIMO reception unit 42. Alternatively, the transmission unit 32 of the mobile relay station 2 includes the control unit 241, the encoding unit 242, the interleaving processing unit 243, the transmission bit string storage unit 244, the modulation unit 245a, and the transmission unit 246a, and the terminal signal reception processing unit 222 of the mobile relay station 2 includes the demodulation unit 431, the demodulated data storage unit 432, a de-interleaving processing unit 433, and the decoding unit 434. In addition, the reception unit 221 of the mobile relay station 2 performs the same processing as that of the reception unit 42a.

Further, in the above-described embodiments, a case where the moving body on which the mobile relay station is mounted is a LEO satellite has been described, but the moving body may be another flying object that flies in the sky such as a drone and a HAPS.

According to the above-described embodiments, a wireless communication system includes a first wireless communication apparatus and a second wireless communication apparatus. For example, the first wireless communication apparatus corresponds to the mobile relay stations 2 and 2a of the embodiment, and the second wireless communication apparatus corresponds to the base stations 4 and 4a of the embodiment. The first wireless communication apparatus includes an encoding unit, an interleaving processing unit, a modulation unit, and a transmission unit. For example, the transmission unit corresponds to the MIMO transmission unit 246 and the transmission unit 246a. The encoding unit divides bit strings to be transmitted in a predetermined period into a plurality of blocks and performs error correction coding for each of the plurality of blocks to generate encoded data. The interleaving processing unit generates a transmission bit string by interleaving encoded data such that bits of the encoded data which has been generated from one of the plurality of blocks are to be transmitted in a distributed manner in a period in which communication quality between the first wireless communication apparatus and the second wireless communication apparatus is higher than a predetermined value in the above-described predetermined period and in a period in which the communication quality is lower than the predetermined value in the above-described predetermined period. The modulation unit modulates a data string which has been interleaved by the interleaving processing unit. The transmission unit divides a transmission bit string, which are modulated by the modulation unit, into a plurality of wireless frames in a predetermined period and wirelessly transmits the transmission bit string to the second wireless communication apparatus.

The second wireless communication apparatus includes a reception unit, a demodulation unit, a de-interleaving processing unit, and a decoding unit. The reception unit corresponds to, for example, the MIMO reception unit 42 and the reception unit 42a of the embodiments. The reception unit receives the wireless frames which have been transmitted from the first wireless communication apparatus. The demodulation unit demodulates the wireless frames which have been received by the reception unit. The de-interleaving processing unit performs de-interleaving on a bit string such that bits which have been transmitted from the first wireless communication apparatus in a distributed manner in a period having communication quality higher than a predetermined value in a predetermined period and in a period having communication quality lower than the predetermined value in the predetermined period are included in one block that is a unit of decoding processing, the bit string being a bit string in which results having been obtained by demodulating, by the demodulation unit, the plurality of wireless frames which have been received in the predetermined period are aligned. The decoding unit decodes the bit string which has been de-interleaved by the de-interleaving processing unit for each block.

The first wireless communication apparatus may further include an encoding setting unit. The encoding setting unit may set an encoding rate of error correction coding in the encoding unit, or may set the type of error correction code used for the error correction coding in the encoding unit. In addition, the first wireless communication apparatus may further include a modulation setting unit. The modulation setting unit sets a modulation scheme used to modulate a transmission bit string in the modulation unit.

When communication quality changes periodically, the above-described predetermined period may be set to be one or a plurality of cycles. Further, the predetermined period may be determined so that an area of a region in which communication quality is higher than a threshold value and an area of a region in which the communication quality is lower than the threshold value are set to be at a predetermined ratio in a graph on a plane representing a relationship between the communication quality and a time.

In addition, the first wireless communication apparatus may be provided in a moving body. For example, the first wireless communication apparatus may be provided in a flying body that flies in the sky, such as a low earth orbit satellite.

Although the embodiments of the present disclosure have been described in detail with reference to the drawings, a specific configuration is not limited to the embodiments, and a design or the like in a range that does not depart from the gist of the present disclosure is included.

REFERENCE SIGNS LIST 1, 1a Wireless communication system
2, 2a Mobile relay station
3 Terminal station
4, 4a Base station
21, 25, 33, 41a Antenna
22 Terminal communication unit
23, 31 Data storage unit
24, 24a Base station communication unit
32, 246a Transmission unit
34, 431 Demodulation unit
41 Antenna station
42 MIMO reception unit
42a Reception unit
43 Base station signal reception processing unit
221 Reception unit
222 Terminal signal reception processing unit
223 Data recording unit
241 Control unit
242 Encoding unit
243 Interleaving processing unit
244 Transmission bit string storage unit
245, 245a Modulation unit
246 MIMO transmission unit
432 Demodulated data storage unit
433 De-interleaving processing unit
434 Decoding unit
2411 Interleaving length setting unit
2412 Encoding setting unit
2413 Modulation setting unit

The invention claimed is:

1. A wireless communication system comprising:
a first wireless communication apparatus; and
a second wireless communication apparatus, wherein
the first wireless communication apparatus includes
an encoder configured to (1) divide a bit string to be transmitted in a predetermined period into a plurality of blocks, (2) perform error correction coding for each of the plurality of blocks, and (3) generate encoded data by lining up all of the results of the error correction coding in a row,
an interleaver configured to perform interleaving on bits of the whole encoded data to generate a transmission bit string such that the bits of the encoded data which has been generated from one of the plurality of blocks are to be transmitted in a time distributed manner in a first period where communication quality between the first wireless communication apparatus and the second wireless communication apparatus is higher than a predetermined value in the predetermined period and in a second period where the communication quality is lower than the predetermined value in the predetermined period,
a modulator configured to modulate the transmission bit string which has been generated by the interleaver, and
a transmitter configured to divide the transmission bit string which has been modulated by the modulator into a plurality of wireless frames in the predetermined period so that the plurality of wireless frames include a wireless frame to be sent in the first period and a wireless frame to be sent in the second period, and wirelessly transmit the plurality of wireless frames to the second wireless communication apparatus using same one or more antennas during the predetermined period, and
the second wireless communication apparatus includes
a receiver configured to receive the plurality of wireless frames which have been transmitted from the first wireless communication apparatus,
a demodulator configured to demodulate the plurality of wireless frames which have been received by the receiver,
a de-interleaver configured to perform de-interleaving on a bit string in which results having been obtained by demodulating, by the demodulator, the plurality of wireless frames which have been received in the predetermined period are aligned, and
a decoder configured to decode the bit string which has been de-interleaved by the de-interleaver.

2. The wireless communication system according to claim 1, wherein
the first wireless communication apparatus further includes an encoding setter configured to set an encoding rate of the error correction coding in the encoder.

3. The wireless communication system according to claim 1, wherein
the first wireless communication apparatus further includes an encoding setter configured to set a type of error correction code to be used for the error correction coding in the encoder.

4. The wireless communication system according to claim 1, wherein
the first wireless communication apparatus further includes a modulation setter configured to set a modulation scheme to be used to modulate the transmission bit string in the modulator.

5. The wireless communication system according to claim 1, wherein
the predetermined period is one or a plurality of cycles in a case where the communication quality changes periodically.

6. The wireless communication system according to claim 1, wherein
the predetermined period is determined such that an area of a region in which the communication quality is higher than a threshold value and an area of a region in which the communication quality is lower than the threshold value are set to be at a predetermined ratio in a graph on a plane representing a relationship between the communication quality and a time.

7. The wireless communication system according to claim 1, wherein
the first wireless communication apparatus is provided in a moving body.

8. The wireless communication system according to claim 1, wherein
the first wireless communication apparatus is provided in a low earth orbit satellite, and
the second wireless communication apparatus is installed on Earth.

9. A wireless communication apparatus comprising:
an encoder configured to (1) divide a bit string to be transmitted to a communication destination apparatus which is a wireless communication apparatus at a communication destination in a predetermined period into a plurality of blocks, (2) perform error correction coding for each of the plurality of blocks, and (3) generate encoded data by lining up all of the results of the error correction coding in a row;

an interleaver configured to perform interleaving on bits of the whole encoded data to generate a transmission bit string such that bits of the encoded data which has been generated from one of the plurality of blocks are to be transmitted in a time distributed manner in a first period where communication quality between the wireless communication apparatus and the communication destination apparatus is higher than a predetermined value in the predetermined period and in a second period where the communication quality is lower than the predetermined value in the predetermined period so that the plurality of wireless frames include a wireless frame to be sent in the first period and a wireless frame to be sent in the second period;

a modulator configured to modulate the transmission bit string which has been generated by the interleaver; and a transmitter configured to divide the transmission bit string which has been modulated by the modulator a plurality of wireless frames in the predetermined period and wirelessly transmit the plurality of wireless frames to the communication destination apparatus using same one or more antennas during the predetermined period.

10. A wireless communication apparatus comprising:

a receiver configured to receive wireless frames wirelessly transmitted from same one or more antennas of a communication destination apparatus during a predetermined period, the communication destination apparatus being a wireless communication apparatus at a communication destination;

a demodulator configured to demodulate the wireless frames which have been received by the receiver;

a de-interleaver configured to perform de-interleaving on a whole bit string such that bits which have been transmitted from the communication destination apparatus in a distributed manner so that the wireless frames include a wireless frame sent in a first period where communication quality between the wireless communication apparatus and the communication destination apparatus is higher than a predetermined value in the predetermined period and a wireless frame sent in a second period where the communication quality is lower than the predetermined value in the predetermined period are included in one block that is a unit of decoding processing, the bit string being a bit string in which all of the results having been obtained by demodulating, by the demodulator, the plurality of wireless frames which have been received in the predetermined period are aligned in a row; and a decoder configured to decode the bit string which has been de-interleaved by the de-interleaver for each block.

* * * * *